US010788548B2

United States Patent
Findeklee et al.

(10) Patent No.: US 10,788,548 B2
(45) Date of Patent: Sep. 29, 2020

(54) SPATIALLY RESOLVED METAL DETECTOR

(71) Applicant: KONINKLIJKE PHILIPS N.V., Eindhoven (NL)

(72) Inventors: Christian Findeklee, Eindhoven (NL); Christoph Leussler, Eindhoven (NL); Peter Vernickel, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 718 days.

(21) Appl. No.: 15/518,533

(22) PCT Filed: Oct. 2, 2015

(86) PCT No.: PCT/EP2015/072798
§ 371 (c)(1),
(2) Date: Apr. 12, 2017

(87) PCT Pub. No.: WO2016/058842
PCT Pub. Date: Apr. 21, 2016

(65) Prior Publication Data
US 2017/0234945 A1 Aug. 17, 2017

(30) Foreign Application Priority Data
Oct. 17, 2014 (EP) .................................... 14189315

(51) Int. Cl.
*G01R 33/28* (2006.01)
*G01R 33/385* (2006.01)
(Continued)

(52) U.S. Cl.
CPC ......... *G01R 33/288* (2013.01); *G01R 33/385* (2013.01); *G01R 33/4608* (2013.01); *G01V 3/107* (2013.01); *G01N 27/72* (2013.01)

(58) Field of Classification Search
CPC ........ G01R 11/19; G01R 11/40; G01R 29/16; G01R 31/021; G01R 31/023;
(Continued)

(56) References Cited

U.S. PATENT DOCUMENTS 7,821,402 B2 * 10/2010 Yang ........................ A61N 1/08
340/572.5
2005/0225327 A1 10/2005 Maschke
(Continued)

FOREIGN PATENT DOCUMENTS

WO 2010125510 A1 11/2010
WO 2013024449 A1 2/2013
(Continued)

OTHER PUBLICATIONS

Y. Eryaman et al.: "Reduction of Implant RF Heating Through Modification of Transmit Coil Electric Field". Magnetic Resonance in Medicine 65:1305-1313, 2011.
(Continued)

*Primary Examiner* — Tung X Nguyen
*Assistant Examiner* — Robert P Alejnikov, Jr.

(57) ABSTRACT

The invention provides for a metal detector (100, 300) with at least a first coil (102) for generating a first magnetic field (108) along a first direction (119). The first coil is a split coil with a first (104) and a second (106) portion (104). A coil power supply (110) separately supplying time varying electrical power to the coil portions. At least one electrical sensor (116, 118) measures electrical data (136) descriptive of the electrical power supplied to at least the first coil portion and the second coil portion. The coils are controlled such as to move a field-free region in a predetermined pattern within a measurement zone. If metal is detected, the pattern is modified for refining localisation of the metallic object.

15 Claims, 8 Drawing Sheets

(51) Int. Cl.
*G01R 33/46* (2006.01)
*G01V 3/10* (2006.01)
*G01N 27/72* (2006.01)

(58) Field of Classification Search
CPC .... G01R 31/041; G01R 31/2813; G01R 1/44; G01R 11/18; G01R 11/185; G01R 19/32; G01R 21/14; G01R 33/0082; G01R 33/0206; G01R 33/028; G01R 33/093; G07F 17/246; G01J 5/16; G01K 7/10; G01L 19/0092; G01N 27/72; G01N 27/9033; G01V 3/10; G01V 3/107; G01V 3/08; G01V 3/081; G01V 3/101; G01V 3/102; G01V 3/104; G01V 3/105; G01V 3/108; G01V 3/15; G01V 3/16; G01V 3/165
USPC .......................... 324/67, 225, 239, 326–329
See application file for complete search history.

(56) References Cited

U.S. PATENT DOCUMENTS

| | | | |
|---|---|---|---|
| 2006/0226833 A1* | 10/2006 | Kubotera | G01V 3/105 324/236 |
| 2013/0034288 A1 | 2/2013 | Boyden et al. | |
| 2014/0111154 A1* | 4/2014 | Roy | G01V 3/081 320/108 |

FOREIGN PATENT DOCUMENTS

| | | |
|---|---|---|
| WO | 2013082289 A1 | 6/2013 |
| WO | 2014071196 A1 | 5/2014 |

OTHER PUBLICATIONS

Finn E J et al: "Ferromagnetic materials in patients: detection before MR imaging", Radiology, Radiological Society of North America, Inc, US, vol. 156, No. 1, Jul. 1, 1985 (Jul. 1, 1985), pp. 139-141.

* cited by examiner

310

SPATIALLY RESOLVED METAL DETECTOR

CROSS REFERENCE TO RELATED APPLICATIONS

This application is a U.S. national phase application of International Application No. PCT/EP2015/072798, filed on Oct. 2, 2015, which claims the benefit of European Application Serial No 14189315.6 filed on Oct. 17, 2014 and is incorporated herein by reference.

TECHNICAL FIELD

The invention relates to metal detectors, in particular to the use of metal detectors for magnetic resonance imaging.

BACKGROUND OF THE INVENTION

Magnetic resonance imaging (MRI) offers excellent clinical images and unique features for medical diagnostics. For MRI it is essential to have high magnetic fields in three different frequency domains, in particular a homogeneous field at zero frequency (the B0-field), a gradient field at acoustic frequencies, and an RF field (B1-field) around the FM-radio frequency (60-300 MHz).

Implants like internal fixations, artificial joints, or pacemakers are typically made of highly conductive metal, on which eddy currents are excited inside a MRI scanner. Since this effect is proportional to the frequency, the B1-field is dominating any coupling issues w.r.t. implants of patients inside an MRI system.

Today, patients with implants often cannot be scanned with an MRI system due to safety issues that mainly cause from RF eddy current induced local SAR. Nowadays, parallel transmit systems are able to shape the RF field in a way, that these eddy currents are avoided. Y. Eryaman et al.: "Reduction of Implant RF Heating Through Modification of Transmit Coil Electric Field". Magnetic Resonance in Medicine 65:1305-1313, 2011 discloses the use of a linear instead of a circular polarized transmit field, which realizes a plane of no electric field at the position of an implant.

This technique was suggested mainly in case of coupling to the implant is dominated by electric fields, i.e. if the implant behaves like an electric dipole. This is the case especially for a pacemaker. However, it does not help that much for big conductive structures. However, there is also a trend to go to local transmit arrays instead of using a volume body coil. If the implant is located not too close to the imaging region, the excitation can simply be avoided by not using elements close to the implant. It is therefore beneficial to locate the implant before scanning. The international application WO2013/024449 which concerns reducing the RF transmit field of an magnetic resonance examination system at the location of an electrically conductive object. This location is found from preliminary magnetic resonance data. Further, a magnetic particle imaging system to detect metal nanoparticles is known from the international application WO2014/071196.

SUMMARY OF THE INVENTION

The invention provides for a metal detector, a magnetic resonance imaging system and a computer program product in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins by the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a metal detector comprising a set of coils comprising at least a first coil for generating a first magnetic field along a first direction within a measurement zone. The first coil is a first split coil. The first coil comprises a first coil portion and a second coil portion. The coil portions are aligned preferably with their coil axes being along a common axis. The coil axes may have a component in common along the common axis. The first coil portion and the second coil portion can be connected to separate electrical power supplies. If electrical current is put through the coil portions in opposite polarities and the windings of the coil portions are wound along equal orientations. They will generate magnetic fields with opposite polarities, but along the same direction. The field lines are parallel to the first direction along the coil portions' common axis. Alternatively, the windings of the coil portions may be wound in opposite orientations and electrical currents of equal polarities are supplied to them they will generate magnetic fields with opposite polarities, but along the same direction along their common axis. If there are additional coils each made up of several, e.g. two coil portions, then the field lines that they produce are parallel to second or third directions.

For example the coils may a cylindrical wound coil and along the cylindrical axis of symmetry the coil the field lines are aligned with the direction of the coil. If gradient coils for a magnetic resonance imaging system are used, then the coil is designed to produce a magnetic field gradient in a particular direction. If the coil is split, the magnetic field produced by the halves of the gradient coils are still directed in the same direction, but the fields can be created with opposing polarities.

The metal detector further comprises a coil power supply for separately supplying time varying electrical power to the set of coils. The power supply is configured for separately supplying the time varying electrical power to at least the first coil portion and the second coil portion. The metal detector further comprises at least one electrical sensor for measuring electrical data from the measurement zone. The measured electrical data represent a response due to the movement of the reduced field zone. The measured data may be descriptive of the electrical power supplied to at least the first coil portion and the second coil portion to generate a time varying magnetic field with the moving reduced-field zone. In this way, the measured electrical data are descriptive of the electromagnetic load of the first and second coil portions changing due to the movement of the reduced-field zone. This can be implemented in that predetermined electrical current strengths are applied to the respective coil portions and the voltage at the first and second coil portions is measured. Another implementation is to apply predetermined electrical voltage levels to the respective coil portions and measure the electrical current at the first and second coil portions. In yet another embodiment, the measured electrical data are descriptive of a response due to eddy currents due to the movement of the reduced field zone. Alternatively, the power and phase from the first and second coil portions can be measured to derive the changing load. This can be done by providing a pick-up coil system with two-dimensional or three-dimensional sensitivity profiles. Such a pick-up coil is provided with two or three coil loops at different, preferably orthogonal, orientations.

Whenever the respective coil portions are supplied electrical currents to such that the coil portions generate magnetic fields of opposite polarity, a field-free point occurs of which the exact location depends on both the geometry of the coil windings and the polarity and strengths of the electrical currents supplied to them. This follows directly form Maxwell's equations for the electromagnetic fields. Around the field-free point the reduced-field zone is formed in which there is some magnetic field strength but considerably weaker than the magnetic field strength at large distance from the field-free point, e.g. the maximum field strength due to one of the coil portions at a location where it is hardly compensated by the field due to the other coil portions. The detailed shape of the reduced-field zone is determined by the geometry of the coil windings and the electrical currents applied to them.

The metal detector further comprises a memory containing machine-executable instructions and a metallic object search pattern. The metallic object search pattern comprises power supply instructions for controlling the power supply to supply the independently time varying electrical power to the set of coils. The power supply instructions further cause the power supply to supply the independently time varying electrical power to the first coil portion and the second coil portion to cause a reduced field zone within a measurement zone. For example the polarity of the power supplied to the two coil portions may be reversed so that in between the two coils there is the reduced field zone. The reduced field zone has a time varying magnetic field component with a magnitude or maximum magnitude below a predetermined magnetic field strength. The metallic object search pattern further causes the power supply to modify the current supplied to the set of coils to move the reduced field zone in a predetermined pattern within the imaging zone.

The metallic object search pattern in other words contains commands which cause time varying electrical power to be supplied to both coil portions in such a way that between them there is a reduced field zone. The commands of the metallic object search pattern adjust the phase and/or amplitude of the time varying electrical power to the set of coils such that the reduced field zone follows the predetermined pattern.

The metal detector further comprises a processor for controlling the operation and function of the metal detector. Execution of the instructions cause the processor to control the power supply using the metallic object search pattern to move the reduced field zone in or through the predetermined pattern. Execution of the instructions further cause the processor to measure the electrical data during the movement of the reduced field zone in the predetermined pattern with the electrical sensor. Execution of the instructions further cause the processor to determine a location of the at least one metallic object within the imaging zone by detecting a change in the electrical data as the reduced field zone is moved in the predetermined pattern.

The time varying magnetic field which is created by supplying the time varying electrical power to the set of coils has the effect of inducing eddy currents within the metallic object. If the metallic object is within the reduced field zone then the eddy currents in the metallic object will be reduced compared to when it is not. The effect of inducing more or less eddy currents in the metallic object can be noted by taking measurements with the electrical sensor. Embodiments may therefore have the ability to determine a spatial location of the metallic object.

In some examples the electrical power or current is supplied to the various coils of the set of coils using a sinusoidal pattern.

In other examples the time varying electrical power has a frequency. The frequency is typical within the range of several kilohertz to several hundred kilohertz.

In some examples there may be one more than one electrical sensor. For example there may be one sensor or multiple sensors for each of the coils of the set of coils.

In another embodiment execution of the instructions further cause the processor to modify the predetermined pattern on the fly after detecting the at least one metallic object during the movement of the reduced field zone in the predetermined pattern. For example if a metallic object is detected the location where the metallic object was detected may cause the processor to redefine or change the pattern such that this location where the metallic object was found is searched in more detail. This could be done with rather complicated algorithms or may be done quite simply. For instance an example of a simple algorithm is that the location of the detected metallic object is used as a starting point for a more localized search pattern. This embodiment may provide for more accurate or detailed information on the location and/or size of the metallic object.

In another embodiment execution of the instructions further cause the processor to repeat the control of the gradient power supply using a modified metallic object search pattern to move the reduced field zone in a further predetermined pattern in the vicinity of the location of the one or more metallic objects and then correct the location of the one or more metallic objects with the newly acquired electrical data acquired by the at least one electrical sensor.

In another embodiment there may be multiple coils in the sets of coils and the direction of the magnetic field in general may be chosen arbitrarily. This may make it easier to find differently-shaped objects. For instance if there is a ring-shaped object there may be locations where there is no induced eddy current. For example if the magnetic flex is not directed through the ring.

In another embodiment execution of the instructions further cause the processor to detect the change in the electrical data as the low field zone is moved in the predetermined pattern by performing any one of the following: detecting a change in a voltage measured with the at least one electrical sensor; detecting a change in a current measured with the at least one electrical sensor; detecting a change in an impedance measured with the at least one electrical sensor; detecting a change in a port metric measurement of the set of coils; detecting a change in a cross-impedance measured between the set of coils; and combinations thereof.

In another embodiment, the time varying electrical power is CW or continuous wave electrical power and the metallic object search pattern is a continuous path through the measurement zone.

In another embodiment, the time varying electrical power is pulsed electrical power and the metallic object search path comprises a set of discreet locations within the measurement zone.

In another embodiment, the electrical sensor is a current sensor and/or a voltage sensor and/or a phase sensor.

In another embodiment, the set of coils further comprises a second coil for generating a second magnetic field in a second direction.

In another embodiment, the second gradient coil is a second split gradient coil. The second gradient coil has a third coil portion and a fourth coil portion. The gradient coil power supply is further configured for separately supplying the time varying electrical power to the third coil portion and the fourth coil portion. The metallic object search pattern further causes the gradient power supply to modify the current supplied to the third coil portion and the fourth coil portion in order to move the reduced field zone in a predetermined pattern within the imaging zone.

In another embodiment, the set of coils further comprises a third coil for generating a third magnetic field in a third direction.

In another embodiment, the third gradient coil is a third split gradient coil. The third gradient coil has a fifth coil portion and a sixth coil portion. The gradient coil power supply is further configured for separately supplying time varying electrical power to the fifth coil portion and the sixth coil portion. The metallic object search pattern further causes the gradient coil power supply to modify the current supplied to the fifth coil portion and the sixth coil portion in order to move the reduced field zone in a predetermined pattern within the imaging zone.

In another embodiment, the electrical data is further descriptive of the electrical power supplied to the second gradient coil and/or the third gradient coil.

In another aspect the invention provides for a magnetic resonance imaging system for acquiring magnetic resonance data from an imaging zone. The magnetic resonance imaging system further comprises the metal detector according to an embodiment. The set of coils for the metal detector are the set of gradient coils. The memory further comprises a pulse sequence for controlling the magnetic resonance imaging system to acquire magnetic resonance imaging data from the imaging zone. The gradient coils are positioned to generate the first magnetic field, the second magnetic field and the third magnetic field in at least the imaging zone. The measurement zone is the imaging zone or overlaps at least partially. The first magnetic field is a first gradient magnetic field. The second magnetic field is a second gradient magnetic field. The third magnetic field is a third gradient magnetic field. Coil power supply to supply electrical power to the first coil, the second coil and the third coil to provide a spatially encoding magnetic field for spatially encoding the magnetic spins within the imaging zone during acquisition of the magnetic resonance data.

In standard magnetic resonance imaging gradient coils they are typically optimized to have a linear slope or magnetic field gradient. Some magnetic resonance imaging systems may have additional gradient coils within non-linear slopes for use in artifact reduction. This may be referred to as Higher Order Shim (HOS) units. The use of gradient coils in a magnetic resonance imaging system to detect the location of metal does not rely on the slope or gradient of the field. Therefore gradient coils which have linear or non-linear slopes may be used for determining the location of the metallic object.

In some embodiments the coil power supply may comprise two different power supply units, one for supplying power to the set of coils when it is being used as a metal detector and a separate power supply when the set of coils are being used as gradient coils for the acquisition of magnetic resonance data. It is also possible to build one power supply that is able to do both jobs.

In another embodiment execution of the instructions further causes the processor to control the magnetic resonance imaging system to acquire the magnetic resonance data using the pulse sequence. Execution of the instructions further causes the processor to reconstruct a magnetic resonance imaging using the magnetic resonance data. The reconstructed magnetic resonance image could for example be stored in some sort of storage unit on a computer or sent across a network to another computer. The reconstructed magnetic resonance image may also be rendered on a display.

In some examples the three coils are aligned in orthogonal directions. So called split gradient coils may be used for the set of coils. For instance a standard magnetic resonance coil with a z-gradient coil may be split. In the non-z-direction the splits coils may be realized for example using something similar to 2× an anti-Helmholtz coil. In this example each of the three gradient coils has two ports. This amounts to two pairs of wires and ends. Each half of the gradient coil may therefore be separately supplied with electrical power. During normal operation the two windings or coil portions are typically connected in series so that the same current occurs. When the system is used as a metal detector the coils are electrically separated and power is supplied to each one separately.

In some examples, the three gradient coils can are aligned in orthogonal directions. At the very least the first direction is not aligned with the second or third direction, and the second and third directions are not aligned.

In another embodiment the pulse sequence causes the processor to acquire magnetic resonance data using a polarized radio-frequency transmit field. Execution of the instructions further cause the processor to modify the pulse sequence using the location of the at least one metallic object such that the polarized RF transmit field causes a zone or region of low AC electrical field at the location of the at least one metallic object. This embodiment may have the benefit that the location of the metallic object was detected and then the pulse sequence is modified such that the RF field in the vicinity of the metallic object is reduced. This may result in improved imaging and improved safely of the subject.

In another embodiment execution of the instructions further cause the processor to modify the pulse sequence to increase the radio-frequency pulse duration to reduce peak radio-frequency fields induced in the imaging zone upon detection of the at least one metallic object.

In another embodiment execution of the instructions further cause the processor to modify the pulse sequence to delay acquisition of the magnetic resonance data in at least one delay period to allow the at least one metallic object to cool upon detection of the at least one metallic object.

In another embodiment the magnetic resonance imaging system comprises a multi-channel radio-frequency system for generating a B1 field in acquisition of the magnetic resonance data. Execution of the instructions further cause the processor to modify the pulse sequence to adjust the B1 field to reduce the B1 field at the location of the one or more metallic objects.

In another embodiment execution of the instructions further cause the processor to calculate a spatially dependent metallic object map within the imaging zone using the location of the at least one metallic object.

In another embodiment execution of the instructions further cause the processor to superimpose the metallic object map on the magnetic resonance data. Note that the combined image could for example be rendered or displayed or stored.

In another embodiment execution of the instructions further cause the processor to determine a volume of the one or more metallic objects using the metallic object map. Execution of the instructions further causes the processor to abort acquisition of the magnetic resonance data if the volume of the one or more metallic objects is above a predetermined volume.

In some examples the mention the gradient coil power supply could have a separate power supply for imaging and for metal detection.

In some examples the time varying electrical power supplied to the coil portions may have an effective frequency of between 10 kHz and about 100 kHz.

In some examples the metallic objects search pattern follows a Liassajou curve.

In another aspect the invention provides for a computer program product comprising machine-executable instructions for a processor controlling a metal detector. The metal detector comprises a set of coils comprising at least a first coil for generating a first magnetic field in a first direction. The first coil comprises a first coil portion and a second coil portion. The split coil as used herein encompasses a coil that can be connected and used as a single coil or can be broken apart and each part can be supplied with electrical power separately. The metal detector further comprises a coil power supply for separately supplying time varying electrical power to the set of coils. The gradient coil power supply is configured for separately supplying time varying electrical power to the set of coils. The metal detector further comprises at least one electrical sensor for measuring electrical data from the measurement field or from the at least first coil portion and the second coil portion. The metal detector further comprises a memory containing the metallic object search pattern, the metallic object search pattern comprises power supply instructions for controlling the coil power supply to supply the independently time varying electrical power to the set of coils.

The power supply instructions further cause the power supply to supply the independently time varying electrical power to at least the first coil portion and the second coil portion to cause a reduced field zone within a measurement zone. The reduced field zone has a time varying magnetic field component with a magnitude below a predetermined magnetic field strength. The metallic object search pattern further causes the gradient power supply to modify the current supplied to the first coil portion and the second coil portion to move the reduced field zone in a predetermined pattern within the measurement zone.

Execution of the instructions cause the processor to control the gradient power supply using the metallic object search pattern to move the reduced field zone in the predetermined pattern. Execution of the instructions further cause the processor to measure the electrical data during the movement of the reduced field zone in the predetermined pattern with the electrical sensor.

In another embodiment execution of the instructions further cause the processor to determine a location of the at least one metallic object within the measurement zone by detecting a change in the electrical data as the reduced field zone is moved in the predetermined pattern.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
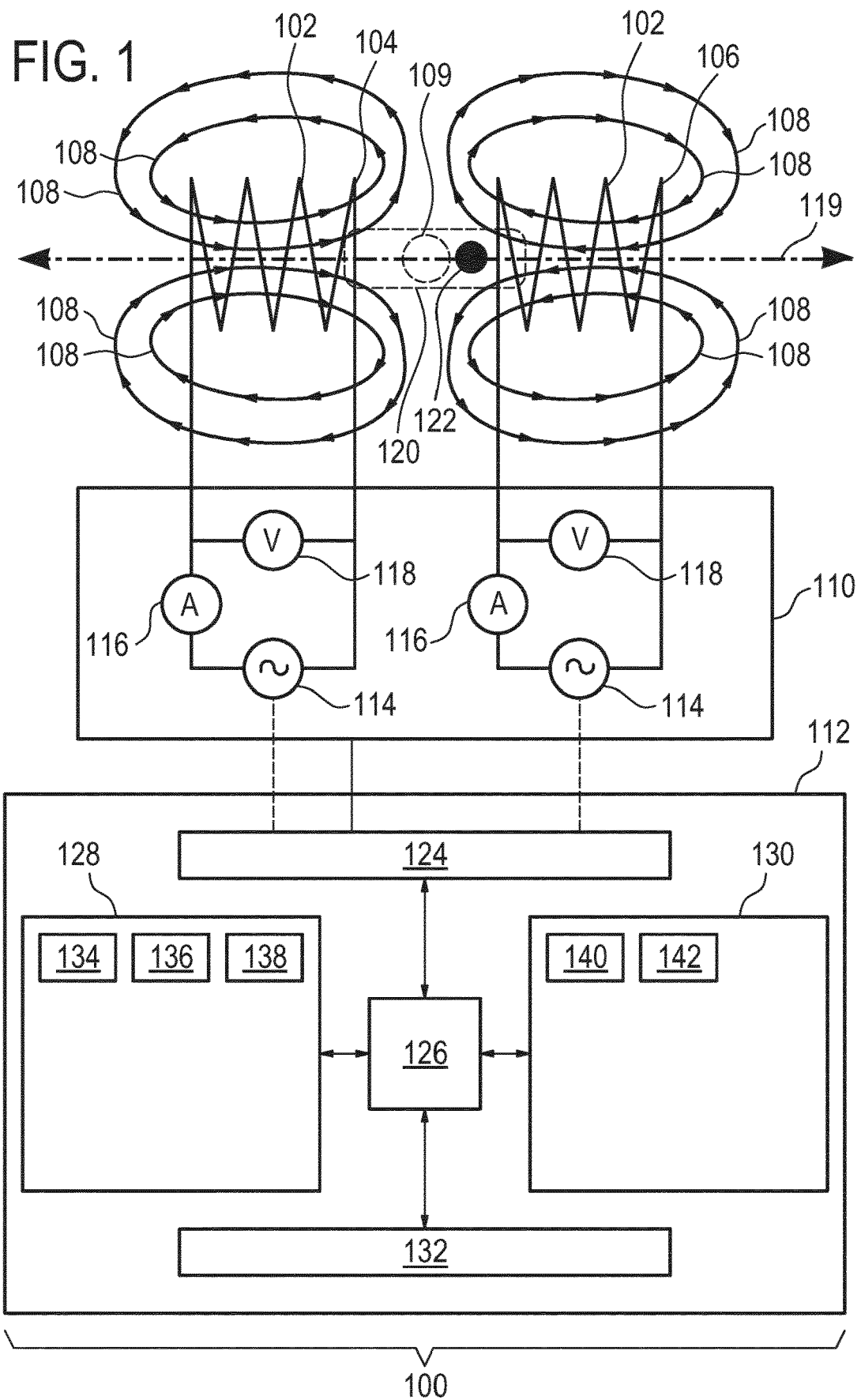
FIG. 1 illustrates an example of a metal detector.

FIG. 1 shows an example of a metal detector 100. The metal detector has a first coil 102. The first coil 102 is split into a first coil portion 104 and a second coil portion 106. The two coil portions 104, 106 may be electrically connected and run as one coil or they may be separately powered. The two coil portions 104, 106 generate magnetic field lines 108. It can be seen in this Fig. that the coils are run such that they generate electrical magnetic fields in opposite directions. The use of cylindrically symmetric coils in FIG. 1 is purely exemplary. The coil portions do not need to by cylindrical coils. For example the coil portions could be part of a "split" gradient coil for a magnetic resonance imaging system.

This results in a reduced field zone 109 which has a magnetic field below a predetermined threshold. The first coil 102 is connected to a coil power supply 110 which is in turn controlled by a computer 112. Within the coil power supply 110 is shown a representative of how the coils 104, 106 may be controlled. They are each connected to a separate AC power supply 114. The AC power supply 114 has current 116 and voltage 118 sensors. The use of these AC power supplies 114 and the sensors 116 and 118 are exemplary. The method can be performed with only current 116 or voltage 118 sensors.

The polarity of the electrical power supplied to each of the coil portions 104, 106 is reversed. By changing the magnitude of electrical power supplied to each of the coil portions 104, 106 the reduced field zone 109 can be moved along a first direction 119. When the two coil portions are operated as a single coil they generate the field in the first direction 119. When they are run in a split mode the two coil portions generate the field in opposite directions resulting in a reduced field zone 109 that is able to be moved along the first direction 119. The dashed lines 120 indicate a measurement zone 120 where the reduced field zone 109 can be moved through. The object 122 is a metallic object and is located on or near the line indicating the first direction 119. When the reduced field zone 109 is over the metallic object 122 there is a reduction in the eddy currents which are induced in the metallic object 122 due to the alternating magnetic fields 108. By moving the reduced field zone 109 to different locations the location of the metallic object 122 can be inferred by taking measurements using the sensors 116 and 118. For instance when there is no metallic object 122 in the vicinity of the coil portions 104, 106 initial reference data could be recorded. The same process can then be repeated when the metallic object 122 is in the vicinity of the coils and within the measurement zone 120. By comparing the previously measured data to newly acquired data the location of the metallic object 122 can therefore be inferred.

The AC power supplies 114 are shown as being connected to a hardware interface 124 of the computer 112. The computer 112 further contains a processor 126 that is connected to the hardware interface 124 as well as computer storage 128, computer memory 130, and a user interface 132.

The computer storage 128 is shown as containing a metallic object search pattern 134. The metallic object search pattern 134 contains instructions which the processor 126 can use to control the AC power supplies 114 to move the reduced field zone 109 is a predetermined pattern along the first direction 119. The computer storage 128 is further shown as containing electrical data 136 that was measured by the sensors 116 and 118.

The computer storage 128 is further shown as containing a location of a metallic object 138 that was inferred from the electrical data 136.

The computer memory 130 contains a control module 140. The control module 140 comprises instructions which enable the processor 126 to control the operation and function of the metal detector 100. The computer memory 130 again shows a data analysis module 142 which is able to process the electrical data 136 to determine the location of the metallic object 138.

The example shown in FIG. 1 illustrates in general how the metal detector may be used to determine the exact spatial location of the metallic object 122. In the example shown in FIG. 1 the location along one single direction 119 is determined. By adding additional coils the location of the metallic object 122 in three dimensions may also be determined. For example split coils that are powered separately may be positioned in orthogonal or in non-aligned directions to provide further information and to be able to move the field free zone 109 in different directions. If there is no background magnetic field either static and/or alternating magnetic fields in other directions may be used to additionally control the location of the field free zone 109. In a magnetic field the additional coils should be split coils also. A static magnetic field does not induce any eddy currents in a static metallic object. Therefore the use of the alternating magnetic fields to induce the eddy current enables the metal detector 100 to function even within large magnetic field regions such as within a magnetic resonance imaging system. If operating within a large magnetic field then the additional coils added to provide additional spatial information about the location of the metallic object they should also be split coils as is shown in FIG. 1.

Figure 2:
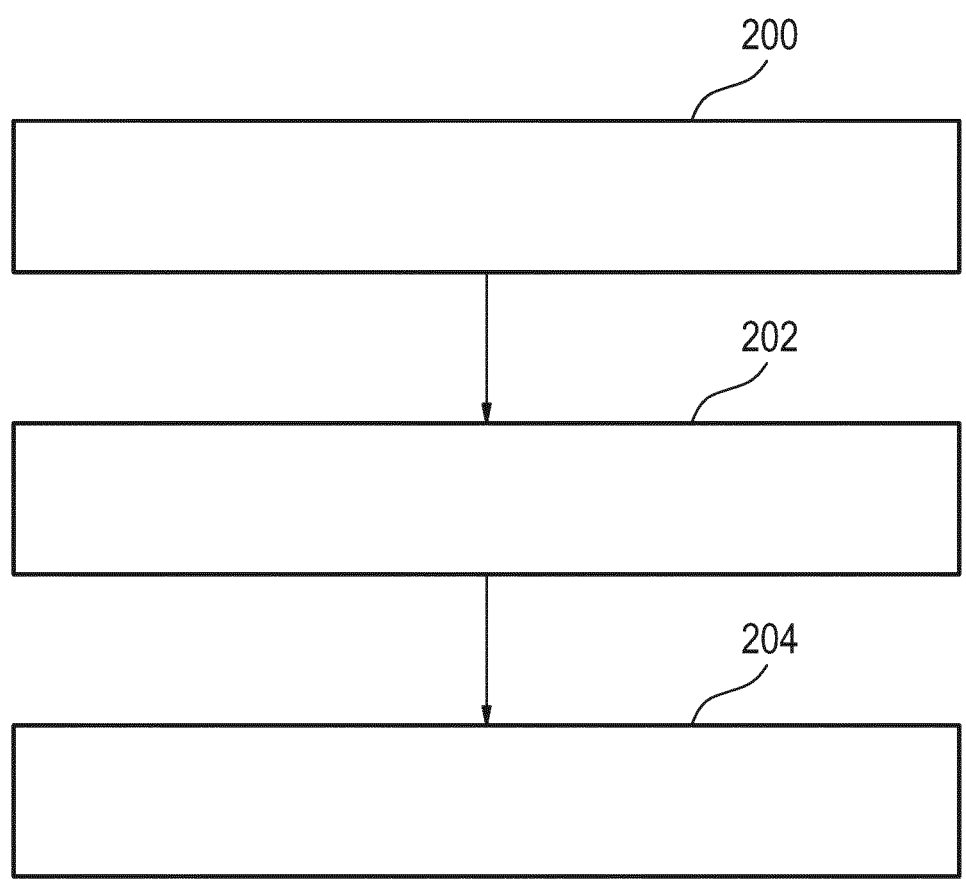
FIG. 2 shows an example of a flow chart which describes how to operate the metal detector of FIG. 1.

FIG. 2 shows a flowchart which illustrates a method of operating the metal detector 100 of FIG. 1. First in step 200 the processor controls the power supply 110 using metallic object search pattern 134 to move the reduced field zone 109 according to the predetermined pattern. Next in step 202 the processor 126 measures the electrical data 136 using the sensors 116 and 118 during the movement of the reduced field zone 109 according to the predetermined pattern in the metallic object search pattern. Finally in step 204 the processor 126 uses the module 142 to determine a location 138 of the at least one metallic object 122 within the measurement zone 120. This is accomplished by detecting a change in the electrical data 136 as the reduced field zone 109 is moved in the predetermined pattern and over the metallic object 122.

Figure 3:
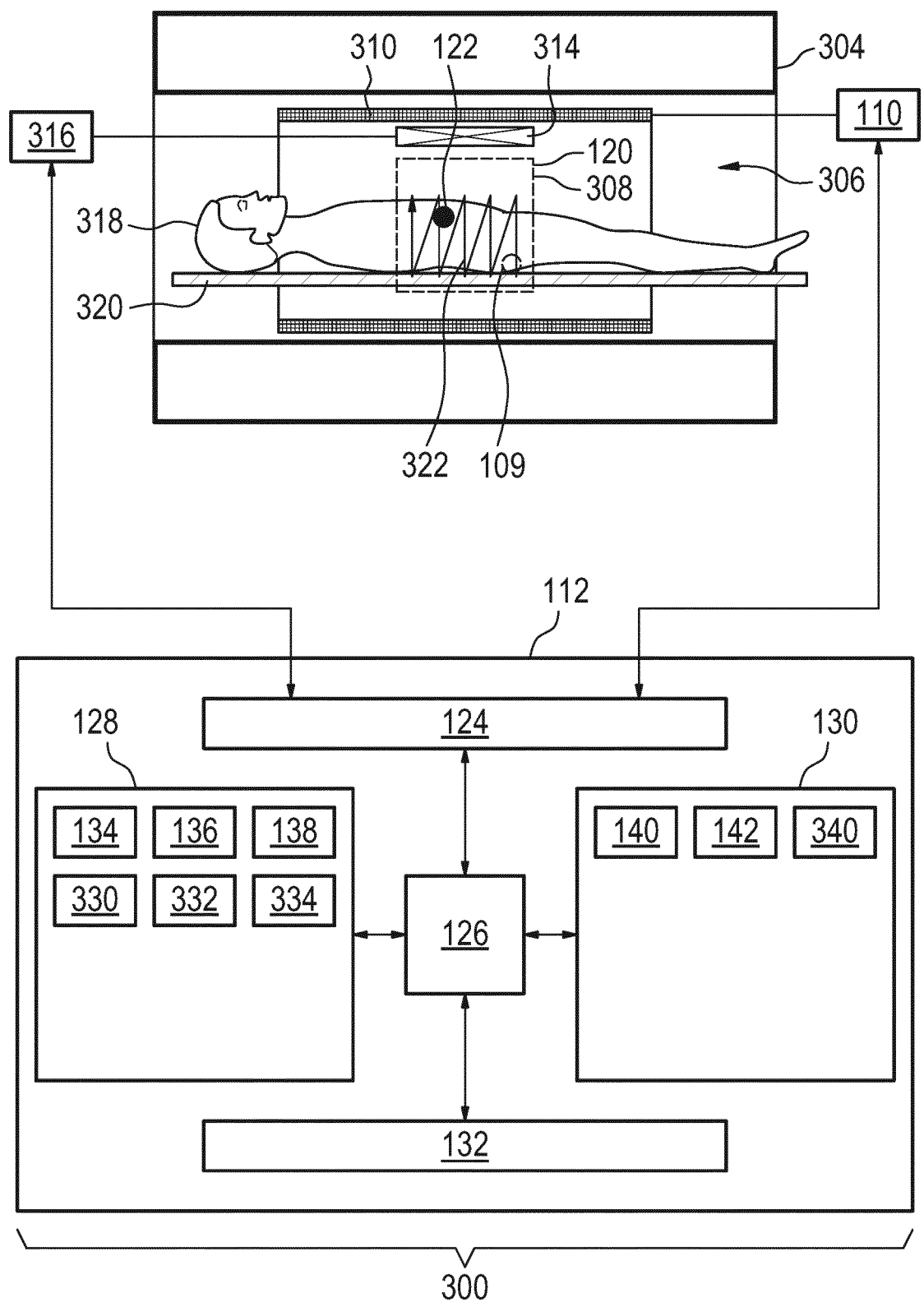
FIG. 3 illustrates an example of a magnetic resonance imaging system which incorporates a metal detector using the gradient coils.

FIG. 3 shows an example of a magnetic resonance imaging system 300. The magnetic resonance imaging system 300 incorporates a metal detector. The magnetic resonance imaging system 300 comprises a magnet 304. The magnet 304 is a superconducting cylindrical type magnet 304 with a bore 306 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 306 of the cylindrical magnet 304 there is an imaging zone 108 where the magnetic field is strong and uniform enough to perform magnetic resonance imaging.

Within the imaging zone is a field of view 309 where magnetic resonance data is collected from. Data is collected in k-space and then transformed into image space using a Fourier transform. The k-space data collected is therefore also descriptive of regions outside of the field of view.

Within the bore 306 of the magnet there is also a set of magnetic field gradient coils 310 which is used for acquisition of magnetic resonance data to spatially encode magnetic spins within the imaging zone 308 of the magnet 304. The magnetic field gradient coils are unshielded magnetic gradient field coils. The magnetic field gradient coils 310 are connected to a magnetic field gradient coil power supply 110. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

The gradient coils 310 comprise a set of coils with a first coil, a second coil and a third coil. All of the gradient coils are split coils. The imaging zone in this case 308 is identical with the measurement zone 120. By applying an alternating power supply to each portion of the split gradient coils a reduced field zone 109 can be made which can be moved within the measurement zone 120. For instance if there is a metallic object 122 within the subject 108 the reduced field zone 109 can be moved along a path 322 to detect the location of the metallic object 122.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the transceiver 316 may also represent a separate transmitter and receivers. The radio-frequency coil 314 may also have multiple receive/transmit elements and the radio frequency transceiver 316 may have multiple receive/transmit channels.

The magnetic field gradient coil power supply 110 and the transceiver 316 are connected to a hardware interface 124 of computer system 112. The computer system 112 further comprises a processor 126. The processor 1226 is connected to the hardware interface 124, an optional user interface 132, computer storage 128, and computer memory 130.

The computer storage 128 is shown as distally containing a pulse sequence 330. The pulse sequence 330 is data or instructions which enable the processor 126 to control the magnetic resonance imaging system 300 to acquire magnetic resonance data 322. The computer storage 128 is shown as containing magnetic resonance data 322 that was acquired using the pulse sequence 330. The computer storage 128 is further shown as containing a magnetic resonance image 334 that was reconstructed from the magnetic resonance data 332.

The computer memory 130 is shown as further containing an image reconstruction module 340 that was used to reconstruct the magnetic resonance image 334 from the magnetic resonance data 332.

Using a modified gradient coil system an MRI scanner may be used as a metal detector. A spatial resolution can be obtained by a small modification in the existing gradient system, which enables an asymmetric driving of the single gradient channels.

In some MRI scanners, especially scanners combined with LINAC systems, the gradient coil is already today separated in two halves along the z-axis (the direction of the B0 field). By using independent channels for these parts, we are able to shape the gradient field more flexible without much more costs (just a few more gradient cables). We use this flexibility to move the field free point (FFP) of the gradient system. The FFP is within the reduced field zone. With this technique, we are able to localize the conductive implant inside the patient.

Figure 4:
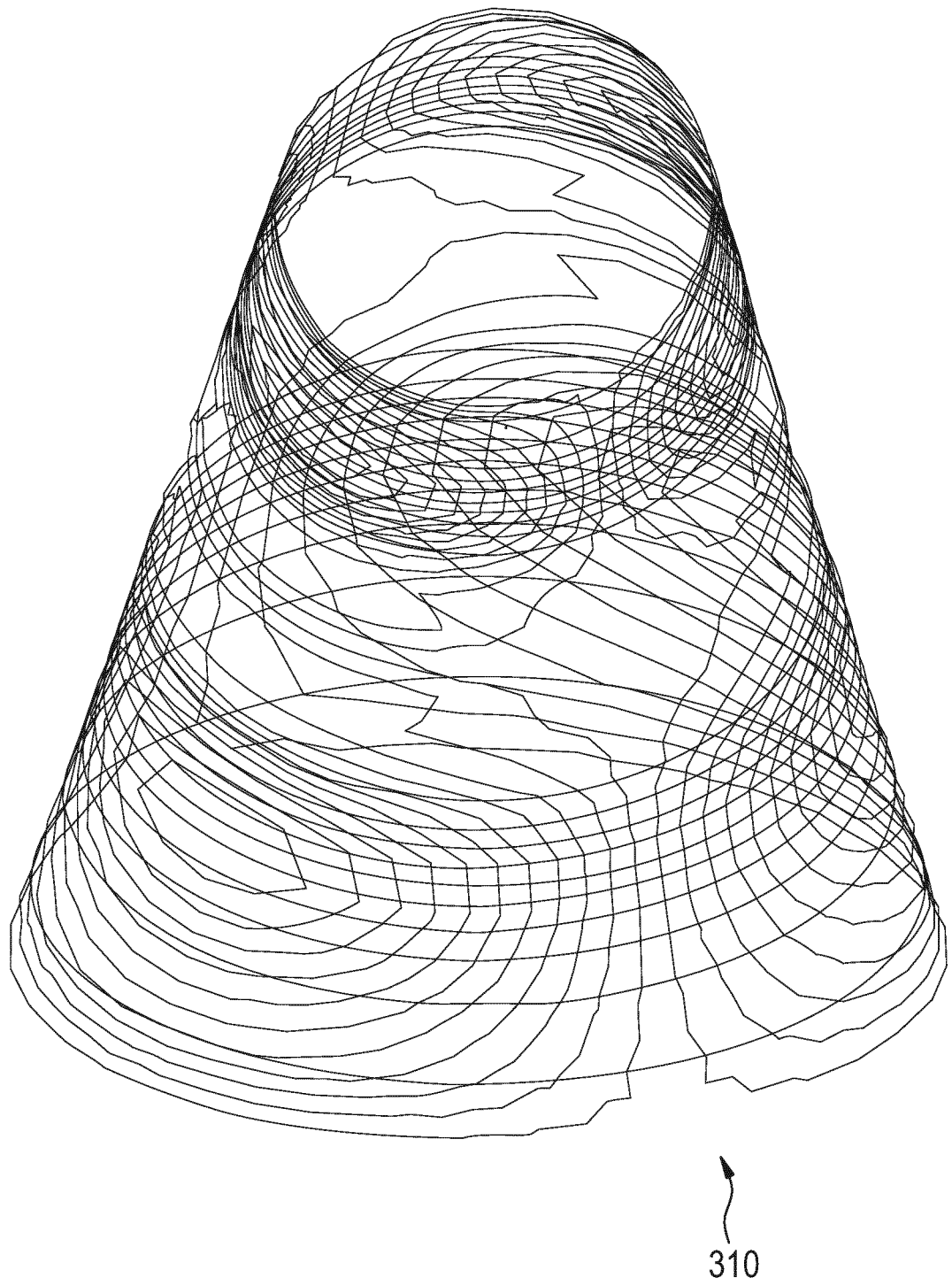
FIG. 4 illustrates a set of split gradient coils.
Figure 5:
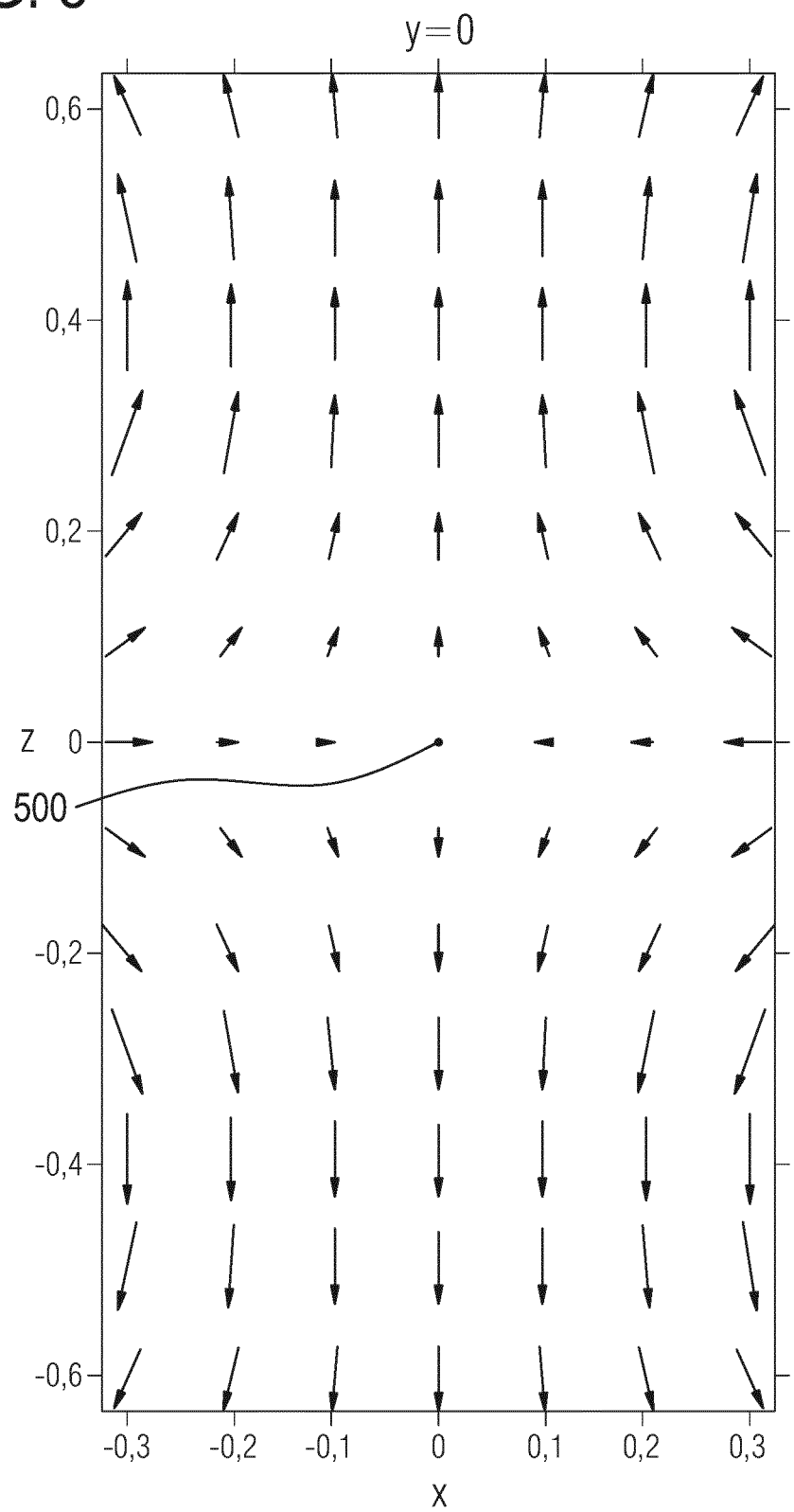
FIG. 5 illustrates the zero field point produced by the gradient coils of FIG. 4.
Figure 6:
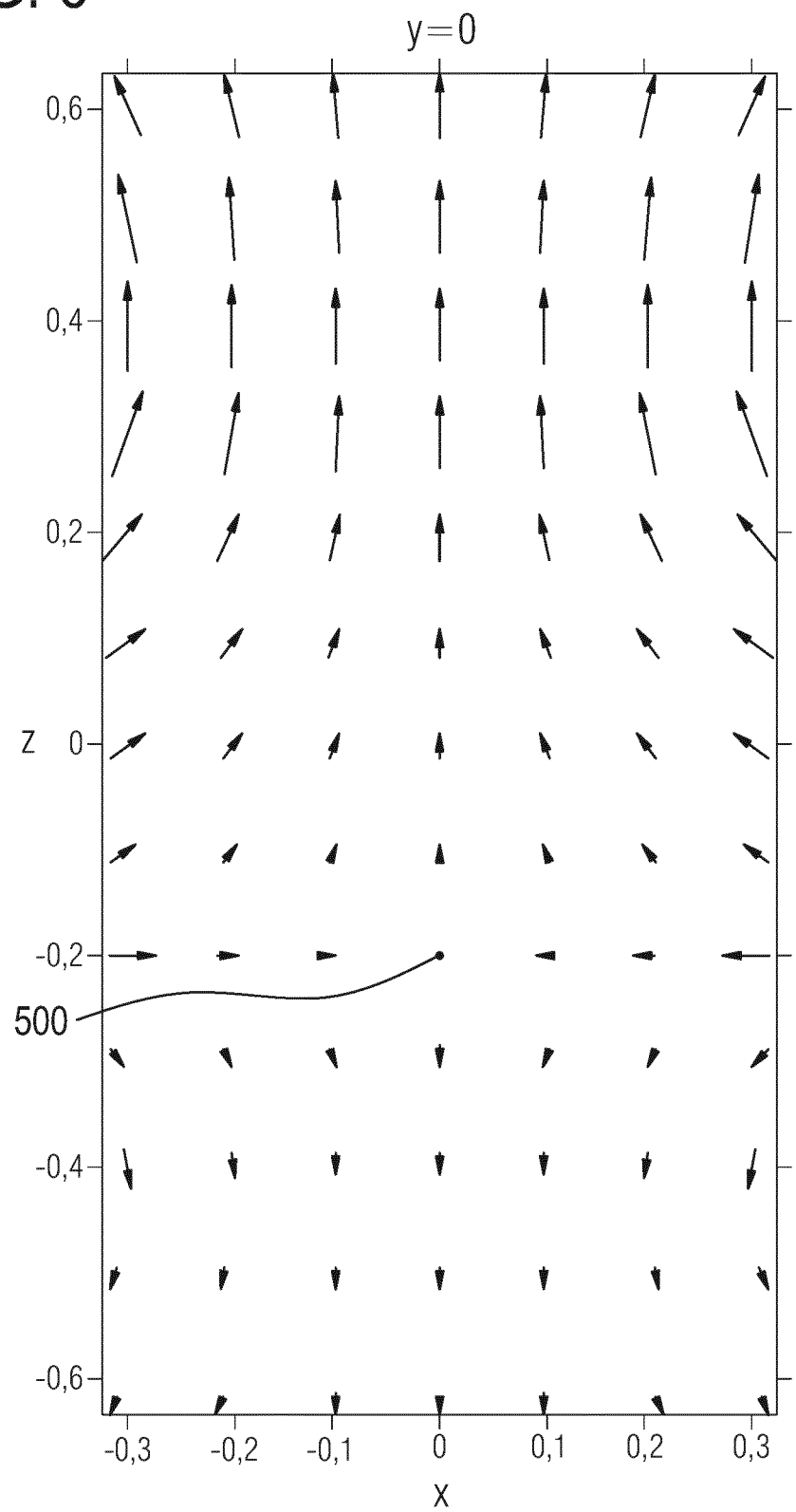
FIG. 6 further illustrates the zero field point produced by the gradient coils of FIG. 4.
Figure 7:
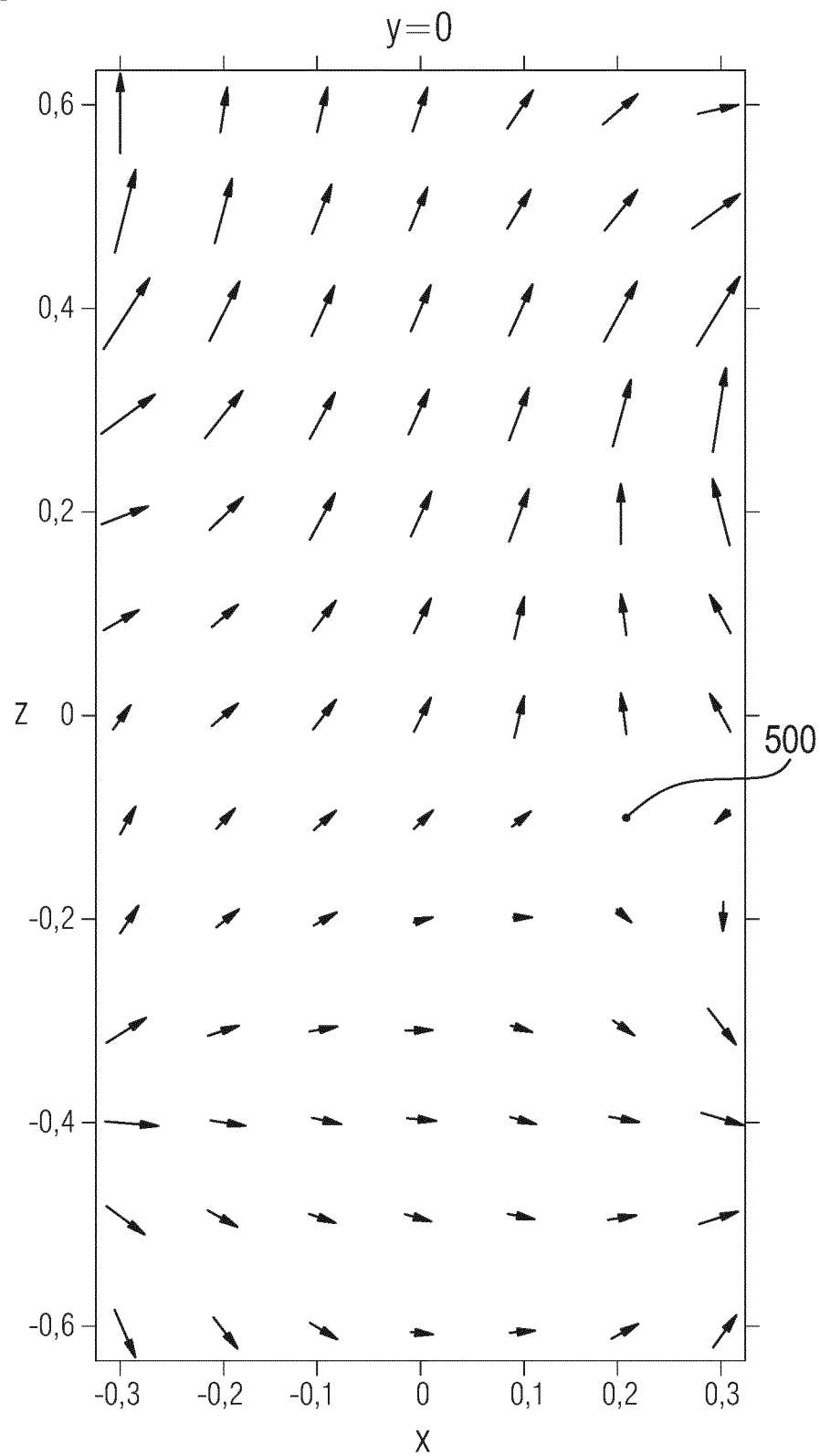
FIG. 7 further illustrates the zero field point produced by the gradient coils of FIG. 4.

FIG. 4 shows an example of a simple gradient coil design 310. A split x and z coil are shown in this Fig. The y coil is not shown. FIGS. 5, 6 and 7 show the field generated by the gradient coil design shown in FIG. 4.

Such a gradient coil produces a magnetic field which is designed for having a strong gradient in its z-component for the three spatial directions. If just the z-gradient coil is switched on, a field as shown at the left in FIG. 2 is produced. The z-component is shaped linearly with the z-axis. In addition, there is exactly one point in space, at which no field at all is generated. Without any further action, this point is located in the isocenter.

With a split gradient coil as is shown in FIG. 4, the currents can flow in an opposite direction for the two halves z<0 and z>0. By adding a constant current excitation, which has the same direction in the both halves, we generate an approximately homogeneous field. By superposition of both fields, we end up in a situation as sketched in the central plot of FIGS. 5 through 7. In this case, the field free point is shifted in z-direction. By also using the homogeneous excitations for the two other field directions x and y, we are able to move the field free point arbitrarily inside the gradient coil.

FIG. 5 shows the magnetic field produced by the coil 310 with a field free point shown as a cross 500. The reduced field zone is a neighborhood around the field free point where the time varying magnetic field has a magnitude below a predetermined threshold. Since only the time varying magnetic field matters for the electrical data the location of metal within a high static magnetic field can be determined accurately.

In FIG. 6 a homogeneous z magnetic field in the z-direction is superimposed by 60%. The field free point has been shifted to the position z=−20 cm.

In FIG. 7 using a homogeneous z field of 70% superimposed on the alternating magnetic field and an x magnetic field 90% the superposition moves the field free point to position x=20 cm and z=−10 cm. The field free point can be moved using alternating magnetic fields superimposed on homogeneous fields.

A standard MR z-gradient coil is similar to an anti-Helmholtz coil. The non-z directions can be realized by coils which approximate two times an anti-Helmholtz coil.

When using split gradient coils, each three gradient coil channels have two ports (two pairs of wire ends. During normal operation the two windings are connected in series, and get the same current magnitude I1=I2, resulting in one external coil port. The orientation of the current is vice versa (the "anti" notation), generating a field free point at a fixed position. Splitting the series connection and allowing I1=α*I2 allows to shift the field free point. Most MR-gradient coils are electrically split, i.e. do not have an internal connection of the two coil portions, fixed wires at the coil terminals at the outside connect the pairs in the desired manner. Removing the connection and connecting the free terminals to additional gradient coil power supplies, creates a split gradient coil. For special purposes (making a gradient coil transparent for ionizing radiation) a mechanically split gradient coil was developed, this coil has two halves with no copper in the central volume of the tube, i.e. a portion of a coil pair, is split in two halves, so four coil ports for one gradient orientation result.

Most metal detectors used today are based on a pulse or a CW excitation. The pulse detector sends a magnetic field pulse and receives immediately after that pulse the magnetic fields of an eddy current. The CW detector sends a constant AC magnetic field and analyzes in the transmit- or in a second receive coil the signal deformation due to additional eddy currents. In principle, both techniques can also make use of nonlinear effects e.g. to classify the material generating the eddy currents.

Both techniques can be applied in a modified MR scanner. The excitation is applied for sweeping the FFP though the scanner volume, providing a characteristic response for each FFP position. The response depends of the conductivity of the material filling the volume weighted with the local field strength. Generally, metallic material has a strong impact on the response since its conductivity is orders of magnitude higher than that of human tissue. However, if the FFP is moved to the position of an metallic implant, it cannot have any impact as eddy currents are zero.

Figure 8:
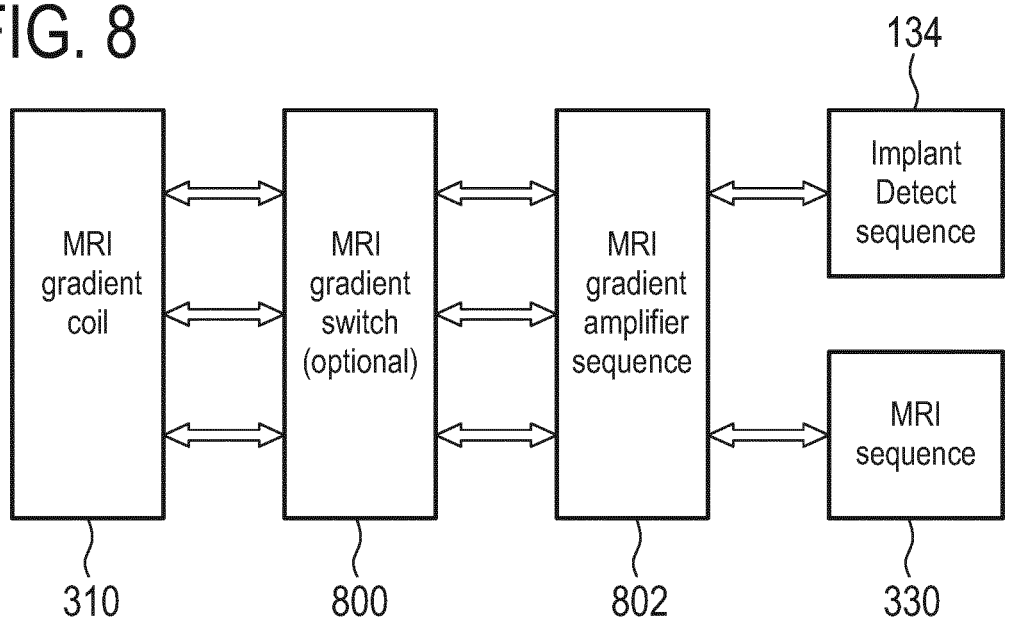
FIG. 8 illustrates some hardware and software features of a modified magnetic resonance imaging system.

FIG. 8 shows some hardware and software features of a modified magnetic resonance imaging system. There is a magnetic resonance imaging gradient coil 310 which is connected to an optional magnetic resonance imaging gradient switch 800. For example the switch 800 may be used to reverse the polarity or disconnect coil portions from each other. The switch 800 may be connected to a magnetic resonance imaging gradient amplifier or controlled by magnetic resonance imaging gradient amplifier sequence 802. This in turn may be controlled by a magnetic resonance imaging sequence or pulse sequence 330 or also be controlled by an implant detect sequence or a metallic object search pattern 134.

Figure 9:
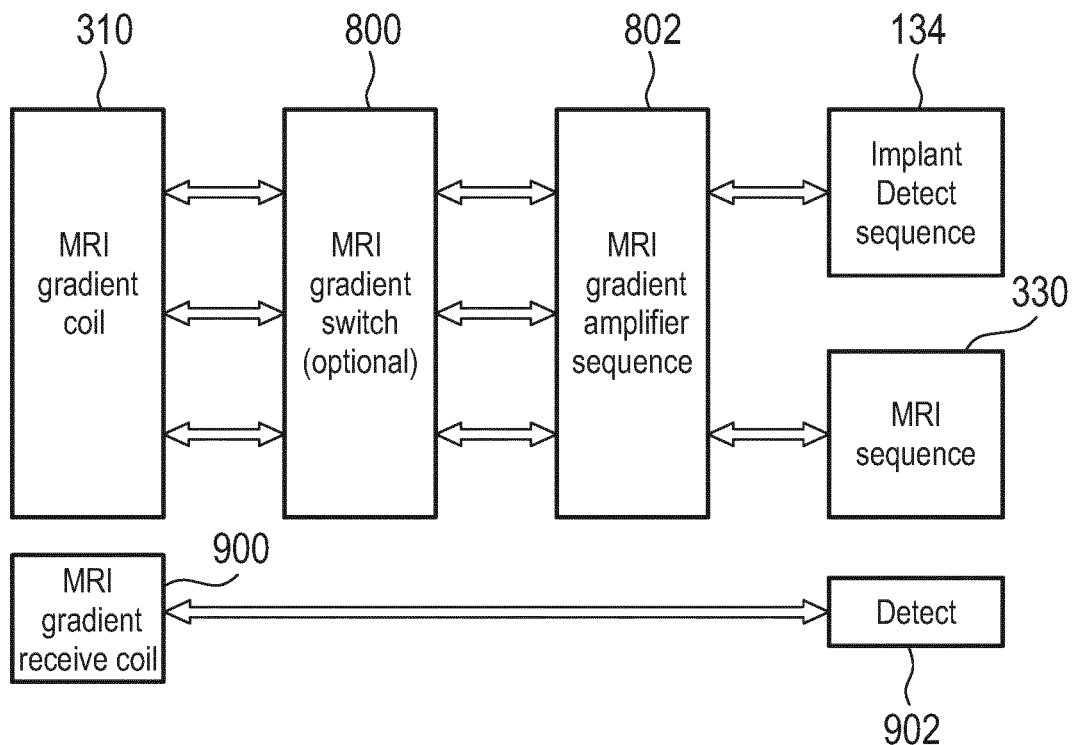
FIG. 9 illustrates some further hardware and software features of a further modified magnetic resonance imaging system.

FIG. 9 shows the same features as FIG. 8 with a few additional features. For instance the system may also include a magnetic resonance imaging gradient coil 900 positioned on or near the subject. For example a local coil may be used to provide the gradient field near a head of a subject. The signals from the magnetic resonance gradient coil 900 may then detected 902 during execution of the implant detect sequence 134 by using receive coils to directly measure the magnetic field generated. For example coils may be used as dedicated sensors for measuring the changing magnetic field can be incorporated into the gradient coil 900. A changing magnetic field will also induce a current in the gradient coils themselves. It is also possible to measure the induced currents in the gradient coil.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 metal detector
102 first coil
104 first coil portion
106 second coil portion
108 magnetic field lines
109 reduced field zone
110 coil power supply
112 computer
114 AC power supply
116 current sensor
118 voltage sensor
119 first direction
120 measurement zone
122 metallic object
124 hardware interface
126 processor
128 computer storage
130 computer memory
132 user interface
134 metallic object search pattern
136 electrical data
138 location of metallic object
140 control module
142 data analysis module
300 magnetic resonance imaging system
304 magnet
306 bore of magnet
308 imaging zone
310 magnetic field gradient coils
314 radio-frequency coil
316 transceiver
318 subject
320 subject support
322 path
330 pulse sequence
332 magnetic resonance data
334 magnetic resonance image 340 image reconstruction module
500 zero field point
800 MRI gradient switch
802 MRI gradient amplifier sequence
900 MRI gradient receive coil
902 Detect

The invention claimed is:

1. A metal detector comprising: a set of coils comprising at least a first coil for generating a first magnetic field along a first direction within a measurement zone, wherein the first coil is a first split coil, where the first coil comprises a first coil portion and a second coil portion;
a coil power supply for separately supplying time varying electrical power to the set of coils, wherein the coil power supply is configured for separately supplying the time varying electrical power to at least the first coil portion and the second coil portion;
at least one electrical sensor for measuring electrical data from the measurement zone or from the at least the first coil portion and the second coil portion;
a memory containing machine executable instructions and a metallic object search pattern, wherein the metallic object search pattern comprises power supply instructions for controlling the coil power supply to supply the independently time varying electrical power to the set of coils, wherein the power supply instructions further cause the power supply to supply the independently time varying electrical power to the first coil portion and the second coil portion to cause a reduced field zone around a field-free point within the measurement zone, wherein the reduced field zone has a time varying magnetic field component with a magnitude below a predetermined magnetic field strength, wherein the metallic object search pattern further causes the power supply to modify the current supplied to the set of coils to move the reduced field zone in a predetermined pattern within the measurement zone; and a processor for controlling the metal detector, wherein execution of the instructions causes the processor to:
control the power supply using the metallic object search pattern to move the reduced field zone in the predetermined pattern,
measure the electrical data being descriptive of a response to the movement of the reduced field zone during the movement of the reduced field zone in the predetermined pattern with the at least one electrical sensor,
determine a location of at least one metallic object within the measurement zone by detecting a change in the electrical data as the reduced field zone is moved in the predetermined pattern wherein execution of the instructions further causes the processor to perform any one of the following: modify the predetermined pattern on the fly after detecting the at least one metallic object during the movement of the reduced field zone in the predetermined pattern; and repeat the control the coil power supply using a modified metallic object search pattern to move the reduced field zone in a further predetermined pattern in a vicinity of the location of the one or more metallic objects and then correct the location of the one or more metallic objects with newly acquired electrical data.

2. The metal detector of claim 1, wherein the electrical data are descriptive of the first and second coil portions' electromagnetic load changing due to the movement of the reduced-field zone or the measured electrical data are descriptive of a response due to eddy currents due to the movement of the reduced field zone.

3. The metal detector of claim 1, wherein execution of the instructions further cause the processor to detect the change in the electrical data as the low field zone is moved in the predetermined pattern by performing any one of the following:
detecting a change in a voltage measured with the at least one electrical sensor;
detecting a change in a current measured with the at least one electrical sensor;
detecting a change in an impedance measured with the at least one electrical sensor; determining a change in a port matrix measurement of the set of coils;
detecting a change in cross-impedance measured between the set of coils; and
combinations thereof.

4. The metal detector of claim 1, wherein
the time varying electrical power is continuous wave (CW) electrical power and the metallic object search pattern is a continuous path through the measurement zone, or
the time varying electrical power is pulsed electrical power and the metallic object search path comprises a set of discrete locations within the measurement zone.

5. The metal detector of claim 1, wherein the at least one electrical sensor is a current sensor and/or a voltage sensor and/or a phase sensor to detect the phase of the time varying electrical power to the set of coils.

6. The metal detector of claim 1, wherein the set of coils further comprises a second coil for generating a second magnetic field in a second direction.

7. The metal detector of claim 6, wherein the set of coils further comprises a third coil for generating a third magnetic field in a third direction.

8. The metal detector of claim 7, wherein the electrical data is further descriptive of the electrical power supplied to the second coil and/or the third coil.

9. The metal detector of claim 7, wherein the second coil is a second split coil, wherein the third coil is a third split coil, wherein the second coil has a third coil portion and a fourth coil portion, wherein the third coil has a fifth coil portion and a sixth coil portion, wherein the coil power supply is further configured for separately supplying the time varying electrical power to the first coil portion, the second coil portion, the third coil portion, the fourth coil portion, the fifth coil portion, and the sixth coil portion, wherein the metallic object search patter further causes the coil power supply to modify the current supplied to the first coil portion, the second coil portion, the third coil portion, the fourth coil portion, the fifth coil portion, and the sixth coil portion to move the reduced field zone in a predetermined pattern within the imaging zone.

10. A magnetic resonance imaging system for acquiring magnetic resonance data from an imaging zone, wherein the magnetic resonance imaging system comprises the metal detector of claim 8, wherein the set of coils are a set of gradient coils wherein the memory further comprises a pulse sequence for controlling the magnetic resonance imaging system to acquire magnetic resonance imaging data from the imaging zone, wherein the set of coils are positioned to generate a first magnetic field, a second magnetic field, and a third magnetic field in at least the imaging zone, wherein the pulse sequence comprises commands to control the coil power supply to supply electrical power to the first coil, the second coil, and the third coil to provide a spatially encoding magnetic field for spatial encoding of magnetic spins within the imaging zone during the acquisition of the magnetic resonance data.

11. The magnetic resonance imaging system of claim 10, wherein execution of the instructions further causes the processor to: control the magnetic resonance imaging system to acquire the magnetic resonance data using the pulse sequence, and reconstruct a magnetic resonance image using the magnetic resonance data.

12. The magnetic resonance imaging system of claim 10, wherein the pulse sequence causes the processor to acquire magnetic resonance data using a polarized RF transmit field, wherein execution of the instructions further cause the processor to modify the pulse sequence using the location of the at least one metallic object such that the polarized RF transmit field causes a zone of low AC electrical field at the location of the at least one metallic object.

13. The magnetic resonance imaging system of claim 10, wherein execution of the instructions further causes the processor to perform any one of the following upon detection of the at least one metallic object: modify the pulse sequence to increase radio frequency pulse duration to reduce peak radio frequency fields induced in the imaging zone,
- modify the pulse sequence to delay acquisition of the magnetic resonance data in at least one delay period to allow the at least one metallic object to cool, and
- combinations thereof.

14. The magnetic resonance imaging system of claim 10, wherein the magnetic resonance imaging system comprises a multi-channel radio frequency system for generating a radiofrequency field (B1) field during acquisition of the magnetic resonance data, wherein execution of the instructions further causes the processor to modify the pulse sequence to adjust the B1 field to reduce the B1 field at the location of the one or more metallic objects.

15. A computer program product embodied on a non-transitory computer-readable medium comprising machine executable instructions for a processor controlling a metal detector, wherein the metal detector comprises:
- a set of coils comprising at least a first coil for generating a first magnetic field along a first direction within a measurement zone, wherein the first coil is a first split coil, wherein the first coil comprises a first coil portion and a second coil portion;
- a coil power supply for separately supplying time varying electrical power to set of coils, wherein the coil power supply is configured for separately supplying the time varying electrical power to the set of coils; at least one electrical sensor for measuring electrical data from the measurement zone or from the at least the first coil portion and the second coil portion; and a memory containing a metallic object search pattern, wherein the metallic object search pattern comprises power supply instructions for controlling the coil power supply to supply the independently time varying electrical power to the set of coils, wherein the power supply instructions further cause the power supply to supply the independently time varying electrical power to the first coil portion and the second coil portion to cause a reduced field zone within the measurement zone to form, wherein the reduced field zone has a time varying magnetic field component with a magnitude below a predetermined magnetic field strength, wherein the metallic object search pattern further causes the coil power supply to modify the current supplied to the set of coils to move the reduced field zone in a predetermined pattern within the measurement zone;

wherein execution of the instructions causes the processor to:
- control the coil power supply using the metallic object search pattern to move the reduced field zone in the predetermined pattern,
- measure the electrical data during the movement of the reduced field zone in the predetermined pattern with the at least one electrical sensor, and
- determine a location of at least one metallic object within the measurement zone by detecting a change in the electrical data as the reduced field zone in moved in the predetermined pattern and modify the predetermined pattern on the fly after detecting the at least one metallic object during the movement of the reduced field zone in the predetermined pattern; and repeat the control the coil power supply using a modified metallic object search pattern to move the reduced field zone in a further predetermined pattern in a vicinity of the location of the one or more metallic objects and then correct the location of the one or more metallic objects with newly acquired electrical data.

* * * * *